US005082537A

United States Patent [19]

Stroszynski et al.

[11] Patent Number: 5,082,537

[45] Date of Patent: Jan. 21, 1992

[54] PROCESS AND APPARATUS FOR ROUGHENING A SUBSTRATE FOR PHOTOSENSITIVE LAYERS

[75] Inventors: Joachim Stroszynski, Wiesbaden; Heinz Boergerding, Walluf; Peter Lehmann, Kelkheim, all of Fed. Rep. of Germany

[73] Assignee: Hoechst Aktiengesellschaft, Frankfurt am Main, Fed. Rep. of Germany

[21] Appl. No.: 500,955

[22] Filed: Mar. 29, 1990

[30] Foreign Application Priority Data

Mar. 30, 1989 [DE] Fed. Rep. of Germany ....... 3910213

[51] Int. Cl.[5] .......................... C25F 3/04; B41N 3/04; G03F 7/02

[52] U.S. Cl. ............................... 205/139; 204/129.35; 204/129.4; 204/DIG. 9; 205/206; 205/214; 205/324

[58] Field of Search ........... 204/129.35, 129.4, 129.43, 204/28, 33, DIG. 9

[56] References Cited

U.S. PATENT DOCUMENTS 3,691,030 9/1972 Stroszynski ........................ 204/32 R
4,087,341 5/1978 Takahashi et al. .................. 204/129
4,272,342 6/1981 Oda et al. ......................... 204/129.4
4,396,468 8/1983 Walls ..................................... 204/17
4,548,683 10/1985 Huang et al. ...................... 204/129.4
4,897,168 1/1990 Boergerding et al. ......... 204/129.43

FOREIGN PATENT DOCUMENTS 2130391 2/1972 Fed. Rep. of Germany .
3012135 10/1986 Fed. Rep. of Germany .

*Primary Examiner*—John Niebling
*Assistant Examiner*—William T. Leader
*Attorney, Agent, or Firm*—Foley & Lardner

[57] ABSTRACT

A mechanically roughened substrate is conveyed through an electrolytic bath and is given a superposed electrochemical roughening, which is carried out by means of electrodes which are arranged in the electrolytic bath at a specific spacing from the substrate. The electrodes are connected to corresponding windings on the secondary side of a three-phase transformer. The corresponding windings on the primary side of the three-phase transformer are connected to a three-phase frequency converter, to which three-phase current is applied via leads. The three-phase frequency converter transforms the line frequency of the three-phase current supplied into a frequency range of about 50 to 300 Hz at a voltage of between about 1 and 380 V.

11 Claims, 2 Drawing Sheets

PROCESS AND APPARATUS FOR ROUGHENING A SUBSTRATE FOR PHOTOSENSITIVE LAYERS

BACKGROUND OF THE INVENTION

The present invention relates to a process for roughening a substrate for photosensitive layers, the surface of which substrate is roughened mechanically and subsequently electrochemically in an aqueous electrolytic bath by applying a three-phase or alternating current to the electrodes opposite the substrate.

Such substrates are employed for the production of presensitized printing plates, the material of the substrates, which are processed into the form of plates or webs, being a metal, especially aluminum. Roughening of, for example, aluminum webs for the production of printing plates is done mechanically, electrochemically or in a combination of a mechanical and electrochemical roughening process. In this regard, the aim is for the aluminum surface to have a specific structure and uniformness, for it must readily accept water and at the same time ensure good adhesion of the photosensitive layer. In the case of mechanical roughening, the surface structures are pyramid-like forms, while electrochemically roughened aluminum surfaces have a sponge-like structure with many cells and depressions.

By comparison with purely electrochemical roughening, mechanical roughening has the advantage of lower specific energy consumption per square meter of substrate surface, but the disadvantage of producing too coarse a surface on which crystalline structures are still present in addition to the pyramidal structures.

Mechanical roughening processes are, in general, processes, such as wire or brush graining, or emery grinding, whereas electrochemical roughening is done, in general, through electrolytic etching in an aqueous electrolytic solution.

German Patent 1,962,728 describes a process for the continuous manufacture of a lithographic surface on a metal web by wet grinding and electrochemical treatment in an electrolyte, in which process the electrolyte is employed to wet the metal surface during grinding and the electrochemical treatment is carried out directly after the grinding. For this purpose, a fine-grained abrasive is suspended in the electrolyte, and the abrasive suspension is blasted onto the moving web in a wide jet extending over the entire width of the metal web. The electrolyte is, for example, an aqueous acidic or aqueous alkaline bath.

In the case of the graining process described in German Offenlegungsschrift 2,130,391, the aluminum plate is first roughened by grinding with a moist emery composition, and after rinsing and, if necessary, cleaning of the plate, the grained surface of the aluminum plate is anodized in a sulfuric acid solution with direct current at a voltage in the region of approximately 10 to 20 V and a current density in the region of approximately 1 to 2.2 A/dm$^2$. Finally, the grained and anodized surface of the aluminum plate is treated with an primer substance for improving the bonding of the photosensitive layer to be applied to the surface to the substrate.

German Auslegeschrift 2,650,762 discloses a process for electrolytic graining of aluminum substrates for lithography by means of an alternating current in an electrolyte essentially containing hydrochloric acid or nitric acid, the alternating voltage applied in this process being such that its anode voltage is greater than the cathode voltage and the ratio of the cathodic coulomb input to the anodic coulomb input is less than 1. The anode alternation of the alternating current is set to be equal to or less than the cathode alternation. The diameter and the depth of the pores or pits in the surface of the aluminum substrate can be predetermined by selecting a suitable ratio of the cathodic to the anodic coulomb input as determined by the voltage setting. The frequency of the regulated alternating current is not limited to the usual frequency range of alternating current, i.e., 50 to 60 Hz. Finer pores are obtained on the grained surface with higher frequencies.

German Patent Specification 3,012,135 describes a process for producing a substrate for lithographic printing plates, in which process the surface of an aluminum plate is mechanically roughened by wet grinding, aluminum is chemically etched from the surface of the plate, and subsequently an electric current having a waveform which is obtained by alternating change in polarity, is applied to the plate in an acidic aqueous solution in such a way that the ratio of the amount of charge formed with the plate as anode to the amount of charge formed with the plate as cathode is 0.5:1 to 1 0 1. The electrolysis is carried out in such a way that, if the plate is the anode, the current density amounts to not less than 20 A/dm$^2$, and the amount of charge formed with the plate as anode amounts to 200 coulomb/dm$^2$ or less, and the anode and cathode voltages are 1 to 50 V. Finally, the plate is subjected to an anodic surface oxidation.

In combining the mechanical and electrochemical roughening the aim is to bring together the advantages of the two processes.

It is expected that the mechanically roughened surface of the metal substrate is finely superposed by cells and depressions, which result from the electrochemical roughening. However, in this regard it emerges undesirably that apart from the pyramidal structures of the mechanical roughening, relatively large pits occur, which are the result of the electrochemical roughening. In order to attain results which are halfway useful, it is necessary for the mechanical roughening to be followed by a disproportionately intense electrochemical roughening, leading to a very steep rise in current consumption which is caused by the resulting pits of the electrochemical roughening. The cause of the pits is too intense and too long an effect of the current which, on the other hand, is required, in turn, in order to arrange the distribution of the pits very uniformly. Just as problematical in the case of the superposition of the mechanically roughened surface of a metal substrate with electrochemical roughening by means of alternating current at a very high working rate of the metal substrate is the formation of so-called electrical cross-strokes in step with the alternating current voltage, these cross-strokes being visible in the form of strokes on the surface of the metal substrate. The cause of these disturbing cross strokes is in all likelihood the continual change in polarity of the alternating current applied at the electrodes.

SUMMARY OF THE INVENTION

It is therefore an object of the present invention to provide a process and apparatus for mechanically and electrochemically roughening the surface of a substrate for photosensitive layers such that the electrochemical roughening superposed on the mechanical pyramidal roughened surface consists of uniformly and finely distributed cells and depressions, and has neither pits nor visible cross-strokes.

In accomplishing the foregoing objects there is provided according to the present invention a process for roughening a substrate conveyed through an aqueous electrolytic bath having a plurality of electrodes comprising applying a three-phase or alternating current to the electrodes, wherein the frequency of said three-phase or alternating current is higher than a line frequency of 50 $H_z$ to 60 $H_z$, preferably between about 50 to 300 $H_z$, and the frequency is selected at a value that is related directly to the rate of conveyance of the substrate through the electrolytic bath.

In a preferred embodiment of the present process the three-phase or alternating current is applied at a frequency, and the substrate is conveyed through the electrolytic bath at a rate, such that a spacing t of electrical cross-strokes on the substrate surface is about 3 to 15 mm.

In another embodiment of the present process the current density of the electrodes is about 250 to 1400 $A/m^2$.

In accomplishing the foregoing objects there also is provided according to the present invention an apparatus for performing the present process, comprising means for connecting a first set of three electrodes partially submerged in an electrolytic bath to the secondary side of a three-phase transformer and means for connecting the primary side of the three-phase transformer to a power transformer for three-phase current via a three-phase frequency converter and at least one regulating transformer.

Another embodiment of the present apparatus comprises means for connecting one pair each of a plurality of pairs of electrodes partially submerged in an electrolytic bath to the secondary sides of a plurality of alternating-current transformers and means for connecting the primary side of each alternating-current transformer to alternating current via a plurality of alternating-current frequency converters.

Further objects, features and advantages of the present invention will become apparent from the detailed description of preferred embodiments that follows.

Figure 1:
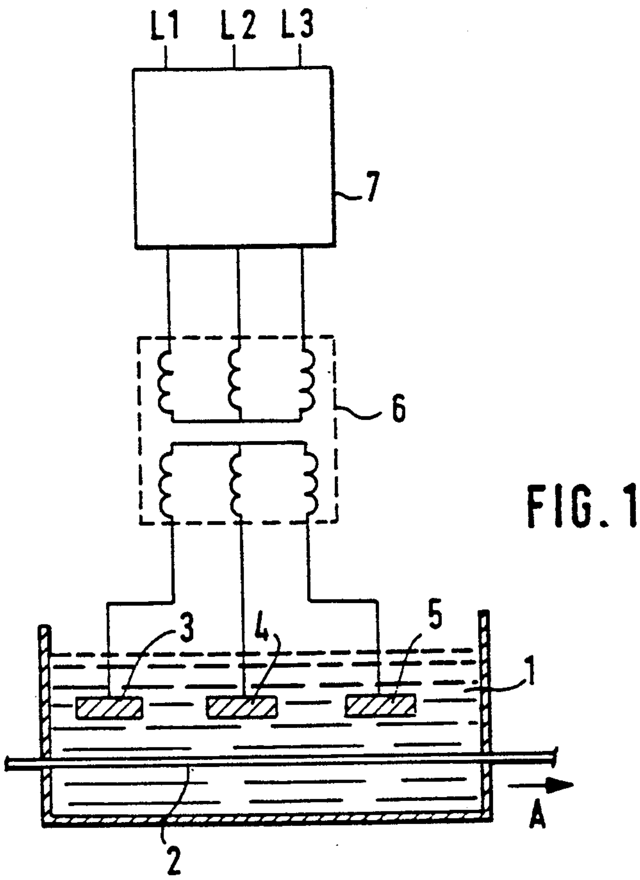
FIG. 1 shows diagrammatically a first embodiment of the device according to the present invention, to the electrodes of which frequency-converted three-phase current is applied.

The invention is explained in more detail below with reference to the drawings.

DETAILED DESCRIPTION OF THE PREFERRED EMBODIMENTS

As mentioned previously, an object of the present invention is to improve a process of the type described above in such a way that the surface of a substrate for photosensitive layers moving at a high working rate is roughened mechanically and electrochemically such that the electrochemical roughening superposed on the mechanical pyramidal roughened surface of the substrate consists of uniformly and finely distributed cells and depressions, and has neither pits nor visible cross-strokes.

According to the present process, the frequency of the three-phase or alternating current is higher than the line frequency of 50 Hz to 60 Hz, and the frequency is adjusted to a higher value with increasing rate of conveyance of the substrate through the electrolytic bath.

In this regard, the three-phase or alternating current frequency is chosen in the range of greater than or equal to about 50 Hz to 300 Hz. According to the present process, the substrate is moved through the electrolytic bath at a constant rate of between about 50 and 150 m/min, and the three-phase or alternating current frequency is chosen such that a spacing t of the electrical cross-strokes on the substrate-surface, which are formed in step with the changes in polarity of the three-phase or alternating current, is less than or equal to about 15 mm.

In particular, the spacing t of the electrical cross strokes on the substrate surface is chosen in the range from about 3 to 15 mm in accordance with the relationship $t=v/f$, the rate of conveyance of the substrate v being in mm/sec and the three-phase or alternating current frequency f being in Hz (1/sec).

The use of alternating or three-phase current with the substantially higher frequency than 50 Hz reduces the spacing t of the cross-strokes to such a degree that the result is a uniform figuration on the surface of the substrate. For this purpose, the frequency of the current can be increased, for example, up to 300 Hz. At a rate of 100 m/min, the spacing t of the electrical cross-strokes on the substrate surface is then less than or equal to 6 mm in the case of a three-phase or alternating current frequency of 300 Hz.

The current density of the electrodes, which dip into the aqueous electrolytic bath, amounts to about 5 to 50% of the current density of the electrodes which are operated with a three-phase or alternating current frequency of 50 Hz for the purely electrochemical roughening. In particular, the current density of the electrodes amounts to about 10 to 20% of the current density of the electrodes which are operated with a three-phase or alternating current frequency of 50 Hz for the purely electrochemical roughening, and this first-mentioned current density lies in the range from about 250 to 1,400 $A/m^2$.

Due to the high working rate, there is a reduction in the application time of the electric current for the electrochemical roughening on the metal surface, and since, in addition, the specific current consumption is correspondingly reduced by comparison with the purely electrochemical roughening, the undesirable pitting does not take place. A very uniform roughening pattern is also achieved on the surface of the metal substrate for very high working rates, and the application time per unit of time is reduced with the increase in the frequency of the current, and this simultaneously counteracts the pitting.

The apparatus for carrying out the process comprises electrodes in the electrolytic bath, which are connected to the secondary side of a first three-phase transformer, whose primary side is connected via a three-phase frequency converter and three-phase regulating transformers to a power transformer for three-phase current.

In one embodiment of the present invention, the three-phase frequency converter transforms the line frequency of the three-phase current in the range from greater than or equal to about 50 to 300 Hz, at a voltage between about 1 to 380 V for the individual phases of the three-phase current, which are supplied via leads. In this regard, the three-phase transformer is wired in a star or delta connection. Moreover, further electrodes are connected in an electrolytic bath to the secondary side of a second three-phase transformer, whose primary side is connected to three-phase current via a three-phase regulating transformer and power transformer. The second three-phase transformer is likewise wired in a star or delta connection. The further electrodes are arranged at the beginning and/or at the end of the electrolytic bath, and the three-phase regulating transformer is supplied with three-phase current at line frequency via leads. In another embodiment of the present invention, alternating current is used instead of three-phase current, and one pair each of electrodes is connected in an electrolytic bath to the secondary side of an alternating-current transformer, and the primary side of each alternating-current transformer is connected to alternating current via an alternating-current frequency converter. In this embodiment, each of the alternating-current frequency converters operates in a frequency range of greater than or equal to about 50 Hz to 300 Hz at a voltage of from about 1 to 380 V of the alternating current.

The apparatus shown diagrammatically in FIG. 1 consists of an electrolytic bath 1 whose electrolyte can be, for example, dilute aqueous sulfuric, nitric or hydrochloric acid. A substrate 2 in the form of a web is moved through the electrolytic bath 1 in the direction A. Only the apparatus for the electrochemical roughening of the surface of the substrate 2 is represented in FIG. 1, the parts of the apparatus or plant in which the mechanical roughening of the substrate surface is undertaken are not shown. Such parts of plants or apparatus are represented and described in detail in German Offenlegungsschrift 1,962,729 and German Patent Specification 1,962,728.

Arranged at a spacing from the substrate 2 in the electrolytic bath 1 are electrodes 3, 4 and 5, which are connected to three windings (not shown in more detail) of the secondary side of a first three-phase transformer 6. The corresponding three windings on the primary side of the three-phase transformer 6 are connected to a three-phase frequency converter 7, which is connected via leads L1, L2 and L3 to regulating transformers (not shown), which are supplied by a common power transformer for three-phase current. The three-phase frequency converter 7 makes it possible for the three-phase current supplied at the line frequency of 50 Hz to be transformed into a three-phase current in the frequency range of greater than or equal to about 50 Hz to 300 Hz. The frequency of the three-phase current is chosen higher than the line frequency of 50 Hz, and with increasing rate of conveyance of the substrate 2 through the electrolytic bath 1 the converted frequency is also set higher. In general, the substrate 2 passes through the electrolytic bath 1 at a constant rate, which can be selected to be about 50 to 150 m/min.

At a very high rate of conveyance v of, for example, 100 m/min, and a frequency $f=50$ Hz of the three-phase current applied to the electrodes 3, 4 and 5, spacings t of 33.3 mm occur in accordance with the relationship $t=v/f$, the rate of conveyance v being in mm/sec, the current frequency in Hz or 1/sec and the spacing t of the so-called cross-strokes on the surface of the substrate 2 in mm. These electrical cross-strokes are caused in conformity with the changes in polarity of the electrodes 3, 4 and 5 by the three-phase or alternating current applied.

The apparatus according to the present invention is operated—in order to render these cross-strokes uniform—in such a way that the freely selectable parameters, that is to say the rate of conveyance of the substrate 2 and the frequency of the current applied to the electrodes 3, 4 and 5, are selected so that the spacing t of the cross-strokes amounts to less than or equal to about 15 mm, preferably about 6 mm.

The current density of the electrodes 3, 4 and 5 amounts to about 5 to 50%, preferably about 10 to 20%, of the current density of the electrodes which are operated with a three-phase or alternating current frequency of 50 Hz for the purely electrochemical roughening. In terms of order of magnitude, the current density of the electrodes 3, 4 and 5 lies in the range from about 250 to 1400 $A/m^2$.

As soon as the electrochemical roughening in the electrolytic bath 1 is terminated, the substrate 2 is, for example, rinsed without intermediate pickling and electrochemically anodized.

The currents supplied to the three-phase frequency converter 7 have voltages which lie in the range from about 1 to 380 V, and are transformed with regard to voltage in such a way that the voltages applied to the electrodes 3, 4 and 5 lie between about 20 and 50 V, preferably about 35 V.

Figure 2:
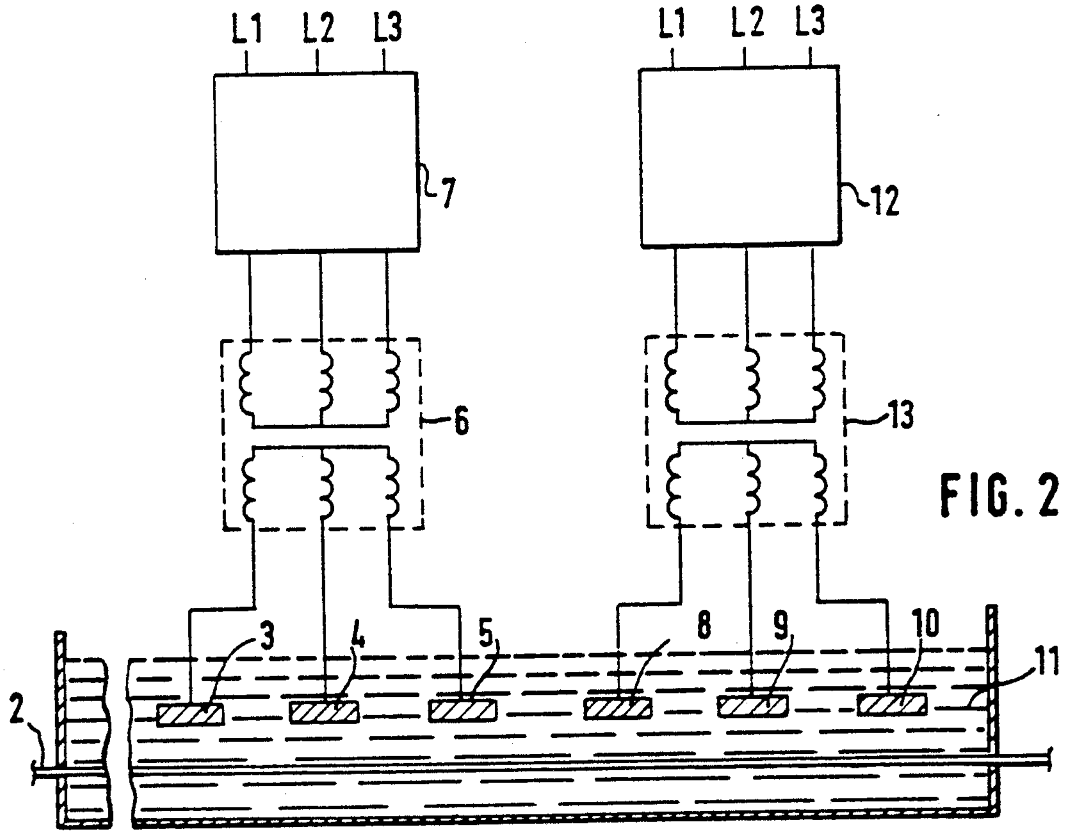
FIG. 2 shows diagrammatically a second embodiment of the present apparatus, in which in addition to the electrodes of the first embodiment further electrodes are present which operate with three-phase current at line frequency.

The embodiment of the present apparatus according to FIG. 2 comprises an electrolytic bath 11, through which the substrate 2 is conveyed. In addition to the electrodes 3, 4 and 5, further electrodes 8, 9 and 10 are located in the electrolytic bath 11, which can contain an electrolyte of the same consistency as the electrolytic bath 1 of the embodiment according to FIG. 1. The direction of travel of the substrate 2 is not represented in FIG. 2, since this substrate can move either from left to right or from right to left. This means that in the case of the direction of movement from left to right the electrodes 8, 9 and 10 are arranged at the end of the electrolytic bath, and in the case when the substrate 2 is moved in the opposite direction the electrodes 8, 9 and 10 are located at the beginning of the electrolytic bath 11.

The electrodes 8, 9 and 10 are connected to the corresponding windings (not shown in more detail) of the secondary side of a second three-phase transformer 13. The corresponding windings on the primary side of the second three-phase transformer 13 are connected to three-phase current via a three-phase regulating transformer 12 and a power transformer (not shown). The second three-phase transformer 13 is wired in a star or delta connection. The connection of the three-phase regulating transformer 12 to the power transformer (not shown) is done via leads L1, L2 and L3. The three-phase regulating transformer 12 is supplied with three-phase current at line frequency, i.e., at 50 Hz, via the leads L1, L2 and L3, a frequency conversion such as in the case of the electrodes 3, 4 and 5 does not take place.

Although this is not represented in FIG. 2, in a manner analogous to the electrodes 8, 9 and 10 an additional three electrodes can be arranged in a correspondingly larger electrolytic bath 11 to the left of electrodes 3, 4 and 5. Such a construction amounts to the presence both at the beginning and also at the end of an enlarged electrolytic bath 11 of a set of three electrodes each, to which three-phase current at line frequency is applied, while the center set of the electrodes 3, 4 and 5 is operated with three-phase current of higher frequency than the line frequency. As already mentioned, it is likewise preferably possible that the electrodes 3, 4 and 5 are arranged at the beginning or at the end of the electrolytic bath and cooperate with the electrodes 8, 9 and 10, which are then located behind or in front of the electrodes 3, 4 and 5.

Figure 3:
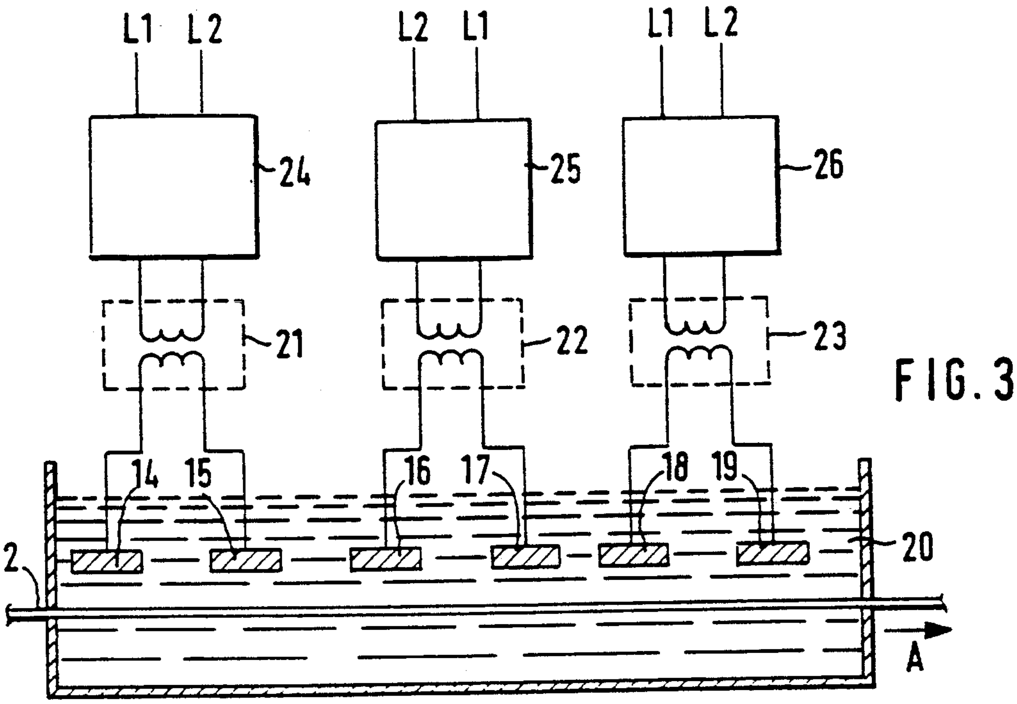
FIG. 3 shows diagrammatically a third embodiment of the present apparatus, to the pairs of electrodes of which frequency-converted alternating current is applied.

As represented diagrammatically in FIG. 3, the third embodiment of the apparatus according to the present invention differs from the first embodiment according to FIG. 1 in that instead of the individual electrodes, to which three-phase current of higher frequency than the line frequency is applied, there are pairs of electrodes 14, 15; 16, 17 and 18, 19 in an electrolytic bath 20 through which the substrate 2 runs in the direction of travel A. The electrolyte in the electrolytic bath 20 has the same composition as has been described with reference to FIG. 1. One pair each of electrodes 14, 15; 16, 17 and 18, 19 is connected to the secondary side of an associated alternating-current transformer 21, 22 or 23. On the primary side, each alternating-current transformer is connected to alternating current via an alternating-current frequency converter 24, 25 and 26. The alternating current is supplied via leads L1, L2 of the frequency converter 24, leads L2, L1 of the frequency converter 25 and leads L1, L2 of the frequency converter 26. The symbols L1 and L2 stand for the two phase leads for alternating current. The electrochemical roughening is done according to the so-called neutral conductor procedure, i.e., the alternating-current circuit of one pair of electrodes 14, 15 is closed via the electrolyte of the electrolytic bath 20, the section of the substrate 2 located below the two electrodes 14, 15, and the secondary winding of the alternating-current transformer 21. Each of the alternating-current frequency converters 24, 25, 26 is operated in a frequency range greater than or equal to about 50 Hz to 300 Hz at a voltage of from about 1 to 380 V of the alternating current.

Figure 4:
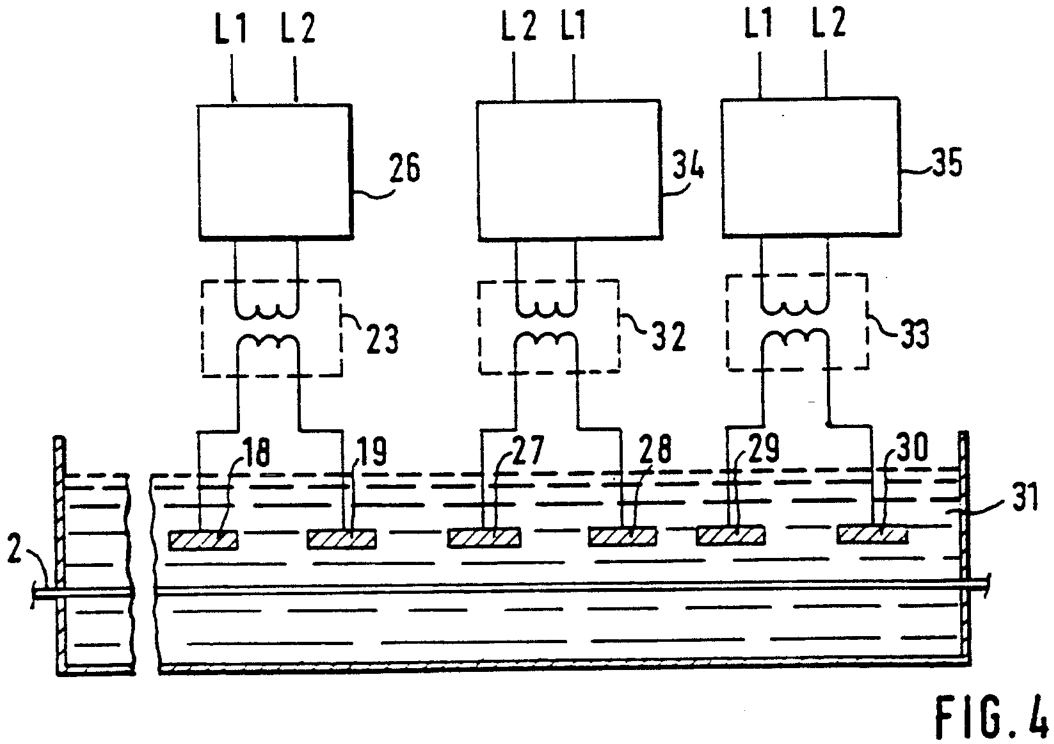
FIG. 4 shows diagrammatically a fourth embodiment of the present apparatus, in which in addition to the pairs of electrodes of the third embodiment further pairs of electrodes are present to which alternating current is applied at line frequency.

The fourth embodiment, shown in FIG. 4, of the present apparatus comprises an electrolytic bath 31 through which the substrate 2 is conveyed. In a manner similar to the embodiment according to FIG. 2, the direction of travel of the substrate 2 is not illustrated in FIG. 4, since this substrate can move through the electrolytic bath 31 either from left to right or from right to left. In this embodiment, in addition to the pairs of electrodes present in FIG. 3 further pairs of electrodes 27, 28 and 29, 30 are present in the electrolytic bath 31. These pairs of electrodes are connected to the windings on the secondary sides of alternating-current transformers 32 and 33, which are supplied on the primary side with alternating current at line frequency via alternating-current regulating transformers 34 and 35. The pairs of electrodes 14, 15; 16, 17; 18, 19 are arranged either at the beginning or at the end of the electrolytic bath 31. It should be pointed out here for reasons of simplicity that FIG. 4 shows only one pair of electrodes 18, 19 in accordance with the third embodiment according to FIG. 3, and that the pairs of electrodes 16, 17 and 14, 15 of FIG. 3 to the left thereof have been left out. Although this is not shown in the diagram, it is further possible to have an arrangement in which both at the beginning and at the end of an enlarged electrolytic bath 31 there are arranged two pairs each of electrodes which are operated with alternating current at line frequency which is applied to the pairs of electrodes via alternating current regulating transformers and alternating-current transformers with a constant transformation ratio, as is the case with the transformers 32 and 33. Independently of whether they are frequency-transformed or have line frequency, the alternating currents supplied possess a voltage level in the range of from about 1 to 380 V. The frequency conversion of the line frequency of the alternating currents supplied moves within the range of from greater than or equal to about 50 Hz to 300 Hz. The current density at the electrodes to which alternating current is applied amounts to about 5 to 50% , preferably about 10 to 20%, of the current density at the electrodes for the purely electrochemical roughening.

With the apparatuses according to the present invention, a superposition of the mechanically roughened surface of the substrate 2, for example by wet brushing with a suspension of pumice and/or quartz powder, is achieved by means of electrochemical roughening, the current frequencies of the three-phase or alternating currents applied to the electrodes being, in general, substantially higher than 50 Hz. This leads to the realization of a roughening pattern optically free from cross-strokes, a fine superposition of the mechanically roughened surface of the substrate by the electrochemically produced roughening, a lower specific current consumption and a very high working rate for the substrate, up to 150 m/min. The peak-to-valley height of the mechanically roughened surface of the substrate is substantially larger, in this regard, than the peak-to-valley height which is obtained with electrochemical roughening. The surface of the substrate is comparatively bright, and after development the printing plate produced with such a substrate exhibits no colored fog.

What is claimed is:

1. A process for continuous roughening of at least one surface of a metal substrate web for the subsequent application of photosensitive layers, comprising:

(a) mechanically roughening the surface, then;

(b) conveying said substrate web at a selected rate of between about 50 and 150 m/min through an aqueous electrolytic bath; and (c) during said conveying step subjecting the surface of said web to an alternating current having a frequency higher than a standard frequency of 50 to 60 Hz such that the surface is electrochemically roughened, wherein said alternating current is applied at a frequency such that a spacing t of electrical cross-strokes on the substrate surface, said electrical cross-strokes being formed in step with changes in polarity of the alternating current, is less than or equal to 15 mm in accordance with the relationship $t=v/f$, the rate of conveyance of the substrate v being in mm/sec and the alternating current frequency F being $H_z$ (1/sec).

2. The process as recited in claim 1, wherein said alternating current frequency is less than or equal to about 300 Hz.

3. The process as recited in claim 2, wherein an alternating current frequency of 300 Hz is applied and said spacing t of said electrical cross-strokes on the substrate surface is less than or equal to 6 mm.

4. The process as recited in claim 1, wherein said alternating current is applied to a plurality of electrodes, which are disposed opposite said substrate within said aqueous electrolytic bath, such that the current density of said electrodes is in the range of from about 250 to 1400 $A/m^2$, which amounts to about 5 to 50% of the current density of electrodes to which an alternating current frequency of 50 to 60 Hz for the purely electrochemical roughening is applied.

5. The process as recited in claim 4, wherein said current density of said electrodes amounts to about 10 to 20% of the current density of electrodes to which an alternating current frequency of 50 Hz for the purely electrochemical roughening is applied.

6. The process as recited in claim 1, further comprising, subsequent to said electrochemical roughening, rinsing and electrochemically anodizing said substrate.

7. The process as recited in claim 1, wherein step (c) further comprises transforming voltages from about 1 to 380 V and applying voltages from about 20 to 50 V.

8. The process as recited in claim 7, wherein the voltage applied is 35 V.

9. The process as recited in claim 1, further comprising applying a direct current electrolytic treatment to said substrate either prior or subsequent to said electrochemical roughening.

10. The process as recited in claim 1, wherein said alternating current comprises a three-phase current.

11. The process as recited in claim 1 wherein said spacing t is about 3 to 15 mm.

* * * * *